(12) United States Patent
Olson et al.

(10) Patent No.: US 12,057,373 B2
(45) Date of Patent: *Aug. 6, 2024

(54) STACKABLE FULLY MOLDED SEMICONDUCTOR STRUCTURE WITH THROUGH SILICON VIA (TSV) VERTICAL INTERCONNECTS AND METHOD OF MAKING THE SAME

(71) Applicant: Deca Technologies USA, Inc., Tempe, AZ (US)

(72) Inventors: Timothy L. Olson, Phoenix, AZ (US); Clifford Sandstrom, Richfield, MN (US); Craig Bishop, Scottsdale, AZ (US); Robin Davis, Vancouver, WA (US)

(73) Assignee: Deca Technologies USA, Inc., Tempe, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 18/126,893

(22) Filed: Mar. 27, 2023

(65) Prior Publication Data

US 2023/0238304 A1    Jul. 27, 2023

Related U.S. Application Data

(63) Continuation of application No. 17/841,627, filed on Jun. 15, 2022, now Pat. No. 11,616,003.
(Continued)

(51) Int. Cl.
*H01L 23/48* (2006.01)
*H01L 23/498* (2006.01)
*H01L 25/065* (2023.01)

(52) U.S. Cl.
CPC ...... *H01L 23/481* (2013.01); *H01L 23/49816* (2013.01); *H01L 25/0657* (2013.01);
(Continued)

(58) Field of Classification Search
CPC ... H01L 25/0657; H01L 21/56; H01L 25/105; H01L 2221/68327; H01L 21/6835;
(Continued)

(56) References Cited

U.S. PATENT DOCUMENTS 10,720,417 B2 * 7/2020 Scanlan ............... H01L 24/09
10,833,052 B2 * 11/2020 Shih ................. H01L 25/0655
(Continued)

*Primary Examiner* — Mamadou L Diallo
(74) *Attorney, Agent, or Firm* — Booth Udall Fuller, PLC; Bryce W. Burnham

(57) ABSTRACT

A semiconductor device may include an embedded device comprising through silicon vias (TSVs) extending from a first surface to a second surface opposite the first surface, wherein the embedded device comprises an active device, a semiconductor die comprising an active surface formed at the first surface, an integrated passive device (IPD), or a passive device. Encapsulant may be disposed over at least five sides of the embedded device. A first electrical interconnect structure may be coupled to a first end of the TSV at the first surface of the embedded device, and a second electrical interconnect structure may be coupled to a second end of the TSV at the second surface of the embedded device. A semiconductor die (e.g. a system on chip (SoC), memory device, microprocessor, graphics processor, or analog device), may be mounted over the first electrical interconnect of the TSV.

20 Claims, 12 Drawing Sheets

Related U.S. Application Data

(60) Provisional application No. 63/217,640, filed on Jul. 1, 2021.

(52) U.S. Cl.
CPC ............... *H01L 2225/06513* (2013.01); *H01L 2225/06517* (2013.01); *H01L 2225/06541* (2013.01)

(58) Field of Classification Search
CPC ............. H01L 23/481; H01L 23/49816; H01L 21/76898; H01L 23/5389; H01L 2221/68331
See application file for complete search history.

(56) References Cited

U.S. PATENT DOCUMENTS

| | | | |
|---|---|---|---|
| 2009/0236686 A1 | 9/2009 | Shim | |
| 2010/0244208 A1 | 9/2010 | Pagaila | |
| 2011/0183464 A1* | 7/2011 | Takahashi | H01L 21/6836 257/E21.511 |
| 2012/0056312 A1* | 3/2012 | Pagaila | H01L 23/3128 257/E23.116 |
| 2012/0104562 A1* | 5/2012 | Pagaila | H01L 25/03 257/773 |
| 2012/0273959 A1* | 11/2012 | Park | H01L 23/481 257/774 |
| 2012/0273960 A1* | 11/2012 | Park | H01L 23/49827 257/774 |
| 2013/0001762 A1* | 1/2013 | Chi | H01L 24/17 257/676 |
| 2014/0264905 A1* | 9/2014 | Lee | H01L 24/97 257/774 |
| 2015/0145128 A1 | 5/2015 | Pagaila | |
| 2016/0218089 A1* | 7/2016 | Lee | H01L 24/96 |
| 2016/0315071 A1 | 10/2016 | Zhai | |
| 2017/0077022 A1* | 3/2017 | Scanlan | H01L 24/19 |
| 2018/0061741 A1* | 3/2018 | Beyne | H01L 25/0652 |
| 2018/0061809 A1 | 3/2018 | Chiu | |
| 2018/0108606 A1* | 4/2018 | Scanlan | H01L 21/4853 |
| 2018/0190514 A1* | 7/2018 | Baloglu | H01L 24/81 |
| 2018/0294229 A1* | 10/2018 | Hu | H01L 23/5381 |
| 2018/0330966 A1* | 11/2018 | Scanlan | H01L 24/19 |
| 2019/0088621 A1 | 3/2019 | Yang | |
| 2019/0244947 A1 | 8/2019 | Yu | |
| 2020/0273829 A1* | 8/2020 | Hsu | H01L 23/5389 |
| 2020/0294938 A1 | 9/2020 | Jain | |
| 2020/0402941 A1* | 12/2020 | Olson | H01L 24/11 |
| 2021/0020605 A1* | 1/2021 | Hiner | H01L 24/96 |
| 2021/0090983 A1* | 3/2021 | Lin | H01L 25/0655 |
| 2021/0366873 A1 | 11/2021 | Gandhi | |
| 2022/0028791 A1* | 1/2022 | Choi | H01L 21/561 |
| 2022/0157740 A1* | 5/2022 | Verhaverbeke | H01L 24/96 |
| 2022/0246532 A1* | 8/2022 | Sandstrom | H01L 24/19 |

\* cited by examiner

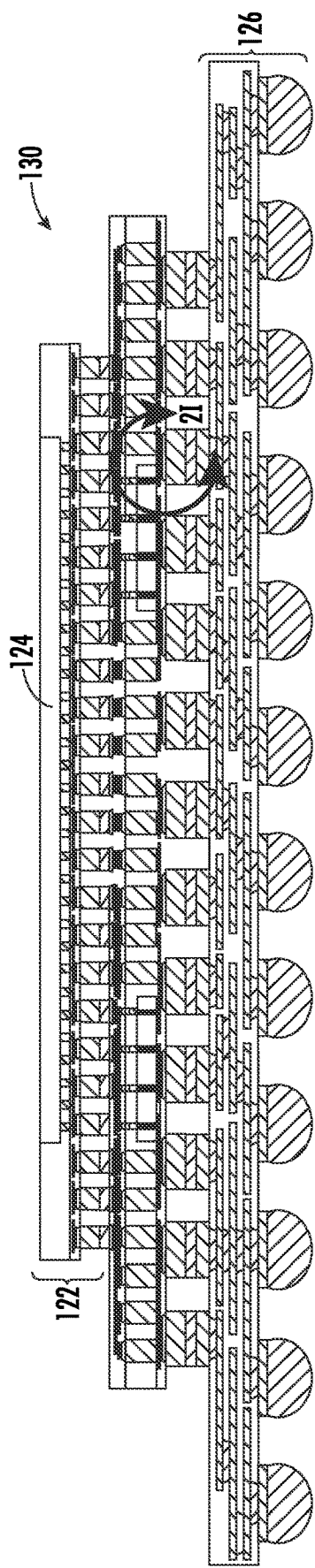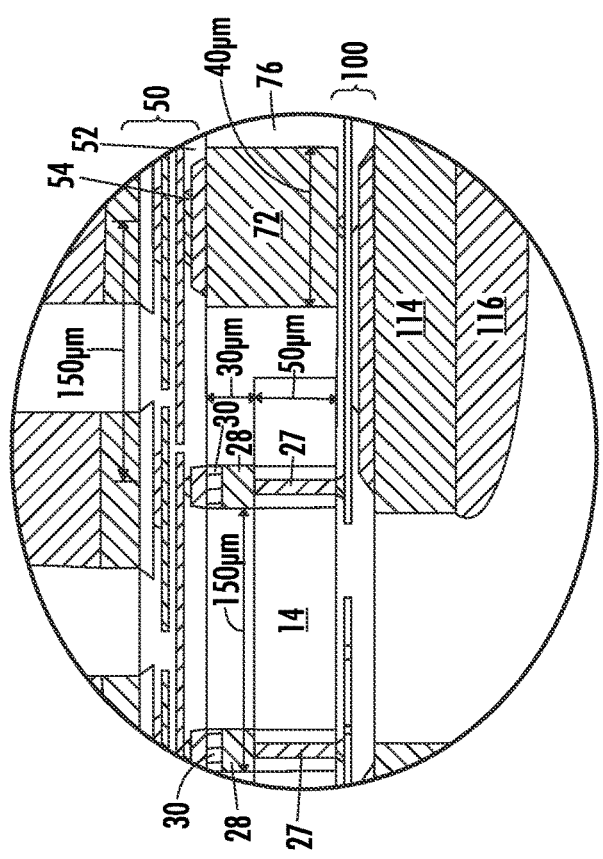
FIG. 2H
FIG. 2I

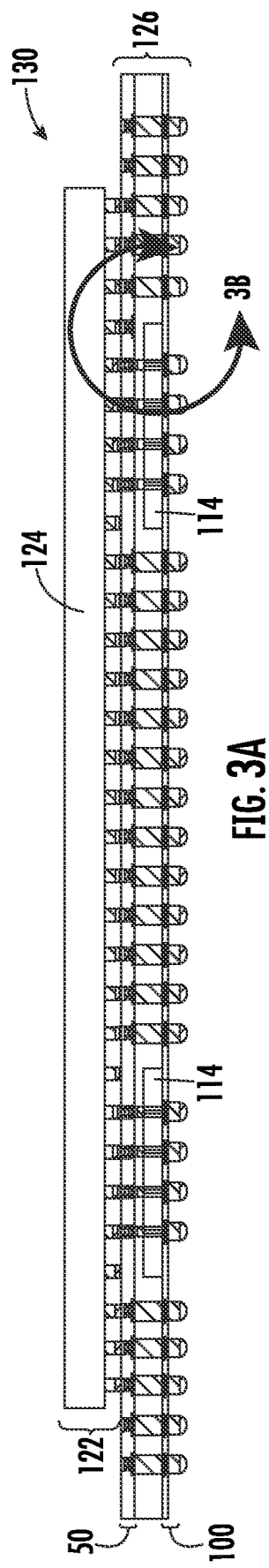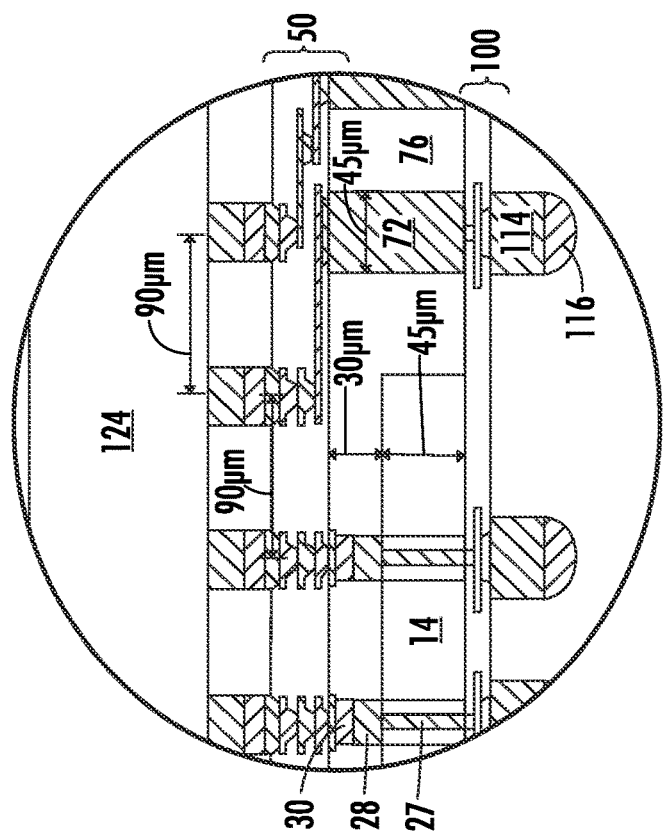
FIG. 3A
FIG. 3B

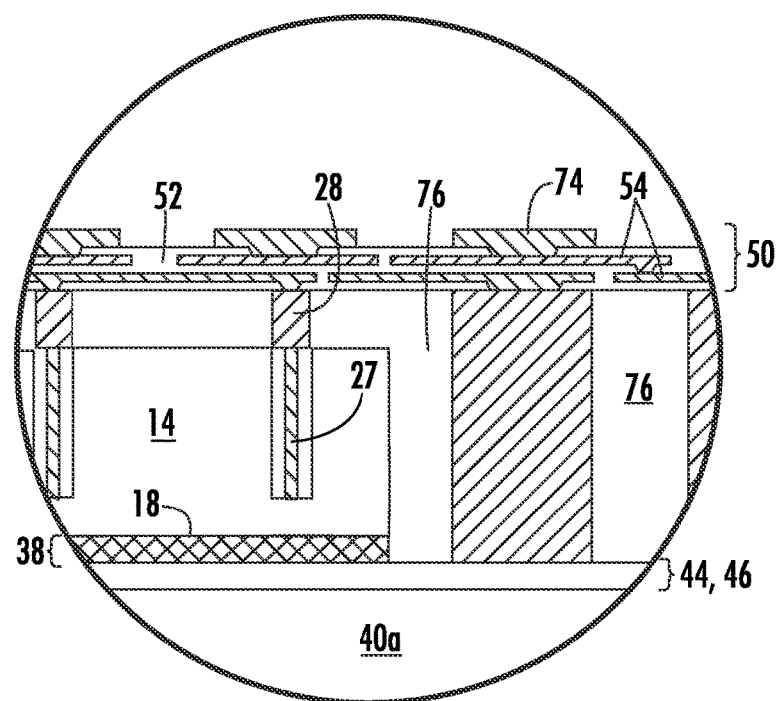
FIG. 4F
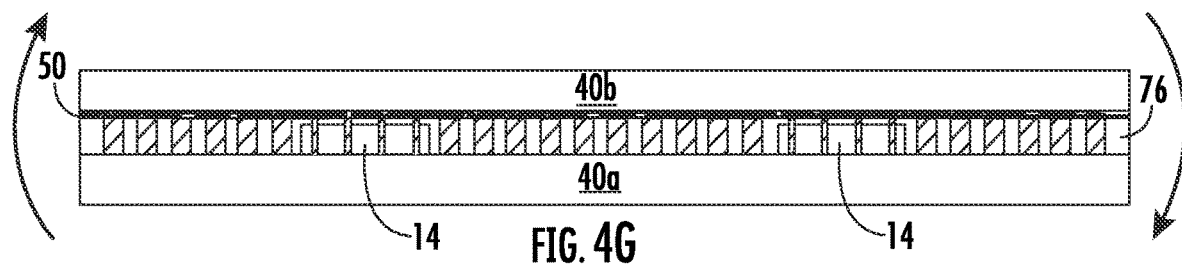
FIG. 4G
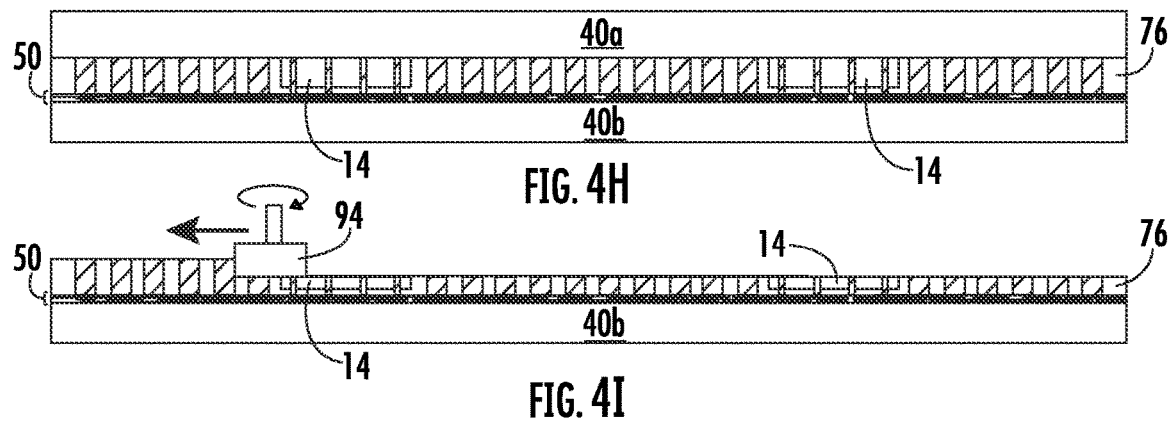
FIG. 4H
FIG. 4I

STACKABLE FULLY MOLDED SEMICONDUCTOR STRUCTURE WITH THROUGH SILICON VIA (TSV) VERTICAL INTERCONNECTS AND METHOD OF MAKING THE SAME

CROSS-REFERENCE TO RELATED APPLICATIONS

This disclosure is a continuation of U.S. Utility patent application Ser. No. 17/841,627, entitled "Stackable Fully Molded Semiconductor Structure with Through Silicon Via (TSV) Vertical Interconnects," which was filed on Jun. 15, 2022, which application claims the benefit, including the filing date, of U.S. Provisional Patent No. 63/217,640, entitled "Stackable Fully Molded Semiconductor Structure with Through Silicon Via (TSV) Vertical Interconnects," which was filed on Jul. 1, 2021, the disclosures of which are hereby incorporated herein by this reference.

TECHNICAL FIELD

The disclosure relates to a fully molded semiconductor package and method of making the same, which includes TSVs through a fully molded embedded device to provide vertical electrical interconnects through the embedded device, with or without solder interconnects. The semiconductor device may further comprise a peripheral area around a semiconductor die comprising vertically oriented electrical interconnects that facilitate package on package (PoP) stacking of multiple semiconductor packages.

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, memories, analog to digital or digital to analog converters, power management and charged-coupled devices (CCDs) as well as MEMS devices including digital micro-mirror devices (DMDs).

Semiconductor devices perform a wide range of functions such as signal processing, high-speed calculations, transmitting and receiving electromagnetic signals, controlling electronic devices, storing information, and creating visual projections for television displays. Semiconductor devices are found in many fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar, complementary metal oxide semiconductors, and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, can be produced more efficiently, have a smaller form factor, and may be less cumbersome when integrated within wearable electronics, portable handheld communication devices, such as phones, and in other applications. In other words, smaller semiconductor devices may have a smaller footprint, a reduced height, or both, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

SUMMARY

An opportunity exists for improved semiconductor manufacturing. Accordingly, in an aspect of the disclosure, a method of making semiconductor device can comprise providing a first temporary carrier comprising embedded device mount sites and a plurality of conductive interconnects disposed around the embedded device mount sites. An embedded device may be disposed over the first temporary carrier. The embedded device may comprise TSVs extending from a first surface to a second surface opposite the first surface. The embedded device may comprise an active device, a semiconductor die comprising an active surface formed at the first surface, an integrated passive device (IPD), or a passive device. An encapsulant may be disposed over the first temporary carrier, around at least five sides of the embedded device, and contacting side surfaces of the embedded device and the conductive interconnects. A first build-up interconnect structure may be disposed over the encapsulant and coupled to first ends of the TSVs at the first surface of the embedded device with solderless interconnects. A second temporary carrier may be provided opposite the first temporary carrier and over the first build-up interconnect structure. The first temporary carrier may be removed. A second build-up interconnect structure may be formed over and coupled to a second end of the TSVs at the second surface of the embedded device. The second temporary carrier may be removed. A semiconductor die may be disposed over, and couple the semiconductor die to, the first build-up interconnect structure. The semiconductor die may comprise a system on chip (SoC), memory device, microprocessor, graphics processor, analog device, clock, or other semiconductor device.

The method may further comprise removing a portion of the encapsulant from over the first temporary carrier, the conductive interconnects, and the embedded device by a grinding process. The first build-up interconnect structure may be coupled to the first ends of the TSVs with a portion of a conductive RDL layer filling a via and without conductive bumps. A pitch of the copper pillar bumps of the second build-up interconnect structure may comprise the pitch being in a range of 50 µm-150 µm. The second electrical interconnect may be formed comprising a portion of a conductive RDL layer filling a via to directly contact the second end of the TSV.

According to another aspect, a method of making a semiconductor device may comprise providing an embedded device comprising TSVs extending from a first surface to a second surface opposite the first surface. The embedded device may comprise an active device, a semiconductor die comprising an active surface formed at the first surface, an IPD, or a passive device. An encapsulant may be disposed over at least five sides of the embedded device, the encapsulant contacting four side surfaces of the embedded device. A first electrical interconnect structure may be coupled to a first end of the TSV at the first surface of the embedded device. A second electrical interconnect structure may be coupled to a second end of the TSV at the second surface of the embedded device. A semiconductor die may be disposed over, and couple the semiconductor die to, the first electrical interconnect of the TSV. The semiconductor die may comprise a SoC, memory device, microprocessor, graphics processor, analog device, clock, or other semiconductor device.

The method may further comprise forming a first build-up interconnect structure solderlessly coupled to first end of the TSV. The second electrical interconnect structure may be formed as a build-up interconnect structure that comprises a portion of a conductive RDL layer filling a via through a dielectric via to directly contact, the second end of the TSV. A conductive bump may be formed at, and directly contact, the first end of the TSV and the first electrical interconnect structure. The second electrical interconnect structure may be formed as a build-up interconnect structure that comprises a portion of a conductive RDL layer filling a via through a dielectric via to directly contact, the second end of the TSV. The embedded device may be electrically coupled through the TSV to a semiconductor die mounted over the embedded device. An RDL may be coupled to the first electrical interconnect of the TSV and coupled to the embedded die. The RDL is formed over and directly contacts the encapsulant, and the encapsulant contacts at least five sides of the embedded device. The second electrical interconnect of the TSV may be coupled to a laminate substrate. Peripheral copper posts may be disposed around the embedded device to facilitate PoP stacking of multiple semiconductor packages.

According to another aspect, the semiconductor device may include an embedded device comprising TSVs extending from a first surface to a second surface opposite the first surface, wherein the embedded device comprises an active device, a semiconductor die comprising active surface formed at the first surface, an IPD, or a passive device.

Encapsulant may be disposed over at least five sides of the embedded device. A first electrical interconnect structure may be coupled to a first end of the TSV at the first surface of the embedded device, and a second electrical interconnect structure may be coupled to a second end of the TSV at the second surface of the embedded device. A semiconductor die (e.g. a SoC, memory device, microprocessor, graphics processor, or analog device), may be mounted over the first electrical interconnect of the TSV.

In some instances, the semiconductor device may comprise the encapsulant contacting the first surface of the embedded device. The first electrical interconnect structure may comprise a conductive bump formed at, and directly contacting, the first end of the TSV. The second electrical interconnect structure may comprise a portion of a conductive RDL layer filling a via through dielectric via as part of a build-up interconnect structure such that the second electrical interconnect structure is formed at, and directly contacts, the second end of the TSV. The embedded device may be configured to be electrically coupled through the TSV to a semiconductor die mounted over the embedded device. The first electrical interconnect of the TSV may directly contact the embedded die without a RDL. The first electrical interconnect of the TSV may be coupled to the embedded die through a RDL. The second electrical interconnect of the TSV may be coupled to a laminate substrate disposed opposite the semiconductor die. The semiconductor device may further comprise peripheral copper posts disposed around the embedded device and configured to facilitate of PoP stacking of multiple semiconductor packages.

The foregoing and other aspects, features, applications, and advantages will be apparent to those of ordinary skill in the art from the specification, drawings, and the claims. Unless specifically noted, it is intended that the words and phrases in the specification and the claims be given their plain, ordinary, and accustomed meaning to those of ordinary skill in the applicable arts. The inventors are fully aware that he can be his own lexicographer if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

The foregoing and other aspects, features, and advantages will be apparent to those of ordinary skill in the art from the specification, drawings, and the claims.

BRIEF DESCRIPTION OF THE DRAWINGS

FIGS. 2A-2I illustrate the formation of a fully molded interposer module with embedded peripherals and peripheral conductive posts or electrical interconnects, which can be mounted to a SoC, printed circuit board (PCB) or substrate, or both.

FIGS. 3A and 3B illustrate another aspect of a TSV interposer module.

FIGS. 4A-4L illustrate another aspect of forming a fully molded interposer module with embedded peripherals and peripheral conductive posts or electrical interconnects without solder, which can be mounted to a SoC, printed circuit board (PCB) or substrate, or both.

DETAILED DESCRIPTION

Figure 1A:
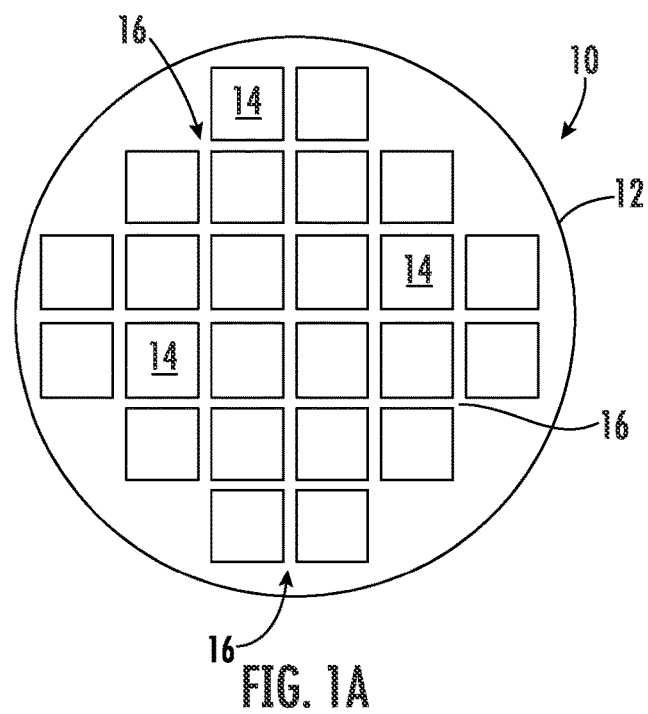
FIGS. 1A-1D illustrate the formation of an embedded device (e.g., peripherals or other passive or active devices) comprising TSVs that will be embedded into an interposer module.

The present disclosure includes one or more aspects or embodiments in the following description with reference to the figures, in which like numerals represent the same or similar elements. Those skilled in the art will appreciate that the description is intended to cover alternatives, modifications, and equivalents as may be included within the spirit and scope of the disclosure as defined by the appended claims and their equivalents as supported by the following disclosure and drawings. In the description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGS. are illustrative representations and are not necessarily drawn to scale.

This disclosure, its aspects and implementations, are not limited to the specific equipment, material types, or other system component examples, or methods disclosed herein. Many additional components, manufacturing and assembly procedures known in the art consistent with manufacture and packaging are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

The word "exemplary," "example," or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

Where the following examples, embodiments and implementations reference examples, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, such as by a stripping process, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the photoresist material are partially removed, so as to provide a pattern or electroplating template for the subsequent formation of structures, such as patterning redistribution layers (RDLs), under bump mentalization (UBM), copper posts, vertical interconnects, or other desirable structures. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle, masks or direct write imaging design are transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes or electroplating adds the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed by etching or a layer is added by electroplating. The process of forming, exposing, and removing the photoresist, as well as the process of removing or adding a portion of the semiconductor wafer can be modified according to the particular resist used and the desired results. Negative or positive tones resist can be designed for solvent or base develop solutions.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or base developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photo-solubilization. In photosolubilization, the relatively insoluble resist is exposed to the proper light energy and is converted to a more soluble state. The photosolubilized part of the resist can be removed by a solvent or a base in the development process. The basic positive photoresist polymer is the phenol-formaldehyde polymer, also called the phenol-formaldehyde novolak resin. Removing the soluble portions (i.e. the portions exposed to light) with chemical solvents or base developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface can be beneficial or required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. Alternatively, mechanical abrasion without the use of corrosive chemicals is used for planarization. In some embodiments, purely mechanical abrasion is achieved by using a belt grinding machine, a standard wafer backgrinder, or other similar machine. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer can be cut along non-functional regions of the wafer called saw streets or scribes. The wafer is singulated using a laser cutting tool, laser silicon lattice disruption process, dry etch plasma dicing process, or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, redistribution layers, or wirebonds. An encapsulant or other molding material is deposited over the package to provide physical support and electrical isolation. The finished package is then inserted into an electrical system and the functionality of the semiconductor device is made available to the other system components.

Back-end manufacturing as disclosed herein also does more than merely packaging an embedded device or the semiconductor die for structural support and environmental isolation. The packaging described herein further provides non-monolithic electrical interconnection of die for increased functionality & performance. Previously, nearly all advanced semiconductor die were monolithic systems on chips (SoCs) where all electrical interconnect occurred on the silicon wafer during front-end processing. Now, however, work that was traditionally the domain of front-end domain work may be handled or moved to the back-end manufacturing, allowing many semiconductor die (chiplets) to be connected with packaging technology to form a chiplet-based SoC (which is non monolithic) and provides a composite package with greater functionality. The chiplet approach may also decrease waste from defects, increase production efficiency, reliability, and performance. The chiplet approach also allows for heterogeneous integration, where devices built by different front-end processes can be integrated into a composite package.

The electrical system can be a stand-alone system that uses the semiconductor device to perform one or more electrical functions. Alternatively, the electrical system can be a subcomponent of a larger system. For example, the electrical system can be part of a cellular phone, personal digital assistant (PDA), digital video camera (DVC), or other electronic communication device. Alternatively, the electrical system can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction can be beneficial or essential for the products to be accepted by the market. The distance between semiconductor devices must be decreased to achieve higher density.

FIG. 1A shows a plan view of a semiconductor wafer or native wafer 10 with a base substrate material 12, such as, without limitation, silicon, germanium, gallium arsenide, gallium nitride, indium phosphide, or silicon carbide, for structural support. A plurality of embedded components, components, or semiconductor die 14 can be formed on wafer 10 separated by a non-active, inter-die wafer area or saw street 16 as described above. The embedded components 14 may include an active device, a semiconductor die comprising an active surface formed at the first surface, an IPD, an IPD die, a bridge die with conductive interconnects, or a passive device. The saw street 16 can provide cutting areas to singulate the semiconductor wafer 10 into the individual components 14.

Figure 1B:
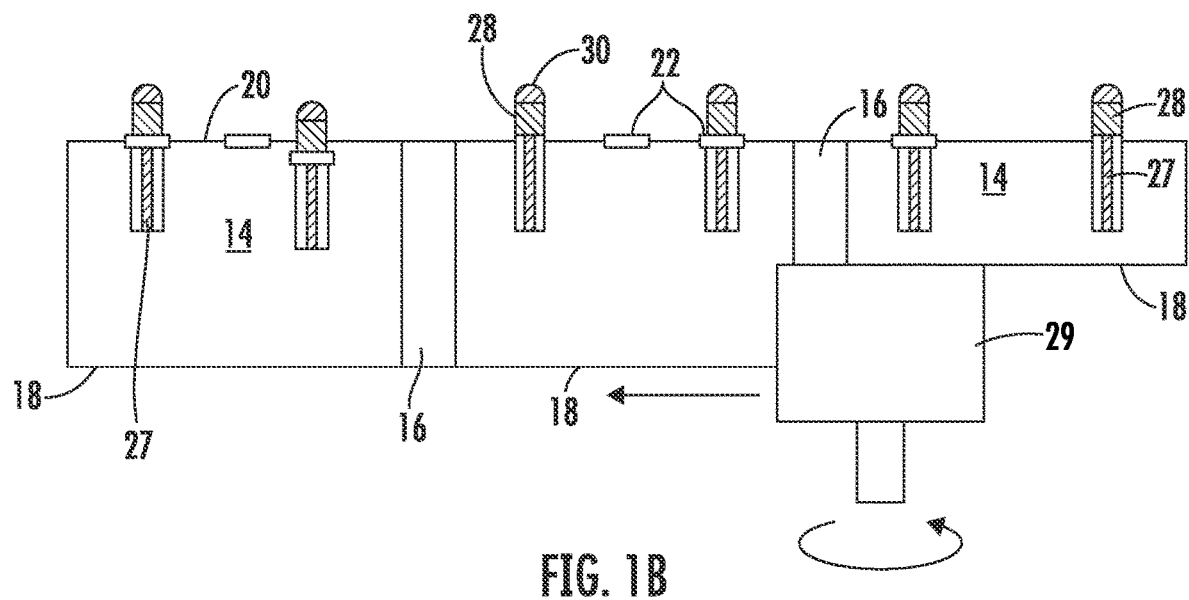

FIG. 1B shows a cross-sectional profile view of a plurality of components 14 from the native wafer 10, show in the plan view FIG. 1A.

Each of the components 14 comprises a backside or back surface 18 and an active surface 20 opposite the backside 18. Active surface 20 may contain analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 20 to implement analog circuits or digital circuits, such as DSP, ASIC, memory, or other signal processing circuit. Components 14 may also contain IPDs such as inductors, capacitors, and resistors, for power management, RF signal processing, clocking or other functions and TSV 27. The TSVs 27 will extend from the active surface to the backside of the component 14 when complete, which will include removing any excess wafer material remaining from the TSVs during manufacture to expose the backside for electrical connection. The TSV 27 extends through the component 14 from the first surface 20 to the second surface 18 to provide through vertical interconnection. The TSVs may be exposed either at an initial backgrinding or material removal phase, such as at the time of the backgrinding shown in FIG. 1B, while in other instances the TSVs 27 may be exposed at a subsequent griding of removal process, such as is shown in FIG. 2D.

An electrically conductive layer 22 is formed over active surface 20 using PVD, CVD, electrolytic plating, electroless plating process, or other suitable metal deposition process. Conductive layer 22 can be one or more layers of aluminum (Al), copper (Cu), Sn, nickel (Ni), gold (Au), silver (Ag), or other suitable electrically conductive material. Conductive layer 22 can be, or operate as, contact pads or bond pads electrically coupled or connected to the circuits on active surface 20. Conductive layer 22 can be formed as contact pads disposed side-by-side a first distance from the edge of components 14, as shown in FIG. 1B. Conductive layer 22 can also be formed as contact pads that are offset in multiple rows such that a first row of contact pads is disposed a first distance from the edge of the die, and a second row of contact pads alternating with the first row is disposed a second distance from the edge of the die. Additionally, conductive layer 22 can be formed as contact pads that are arranged as a full array of pads distributed over the active area of the semiconductor die or chip. In some instances, the contact pads can be arranged in an irregular or asymmetrical array with differing or various spacing among the contact pads including the use of RDL. Additionally, conductive layer 22 can be formed to contact the TSV 27.

FIG. 1B may also include an optional insulating or passivation layer 26 conformally applied over active surface 20 and over conductive layer 22. Insulating layer 26 can include one or more layers that are applied using PVD, CVD, screen printing, slit or slot die coating, spin coating, spray coating, sintering, thermal oxidation, or other suitable process. Insulating layer 26 can contain, without limitation, one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), polymer, polyimide, benzocyclobutene (BCB), polybenzoxazoles (PBO), or other material having similar insulating and structural properties. Alternatively, components 14 are packaged without the use of any PBO layers, and insulating layer 26 can be formed of a different material or omitted entirely. In another embodiment, insulating layer 26 includes a passivation layer formed over active surface 20 without being disposed over conductive layer 22. When insulating layer 26 is present and formed over conductive layer 22, openings are formed completely through insulating layer 26 to expose at least a portion of conductive layer 22 for subsequent mechanical and electrical interconnection. Alternatively, when insulating layer 26 is omitted, conductive layer 22 is exposed for subsequent electrical interconnection without the formation of openings.

FIG. 1B also shows a first electrical interconnect structure, conductive bump, conductive interconnect, or electrical interconnect structure 28 that can be formed as columns, pillars, posts, thick RDLs, bumps, or studs that are formed of copper or other suitable conductive material, which are disposed over, and coupled or connected to, TSV 27. Electrical interconnect structures 28 can be formed directly over TSV on conductive layer 22 using patterning and metal deposition processes such as printing, PVD, CVD, sputtering, electrolytic plating, electroless plating, metal evaporation, metal sputtering, or other suitable metal deposition process. Electrical interconnect structures 28 can be one or more layers of Al, Cu, Sn, Ni, Au, Ag, palladium (Pd), or other suitable electrically conductive material and can include one or more layers. In some embodiments, electrical interconnect structures 28 have a SnAg bump on top formed by plating. In some embodiments, electrical interconnect structures 28 can be formed by depositing a photoresist layer over the components 14 and conductive layer 22 while the components 14 are part of the semiconductor wafer 10. A portion of the photoresist layer can be exposed and removed by an etching development process, and the electrical interconnect structures 28 can be formed as copper pillars in the removed portion of the photoresist and over conductive layer 22 using a selective plating process. The photoresist layer can be removed leaving electrical interconnect structures 28 that provide for subsequent mechanical and electrical interconnection and a standoff with respect to active surface 20.

FIG. 1B also shows the semiconductor wafer 10 can undergo an optional grinding operation with a grinder 29 to planarize the surface and reduce a thickness of the semiconductor wafer 10. A chemical etch can also be used to remove and planarize a portion of the semiconductor wafer 10.

Figure 1C:
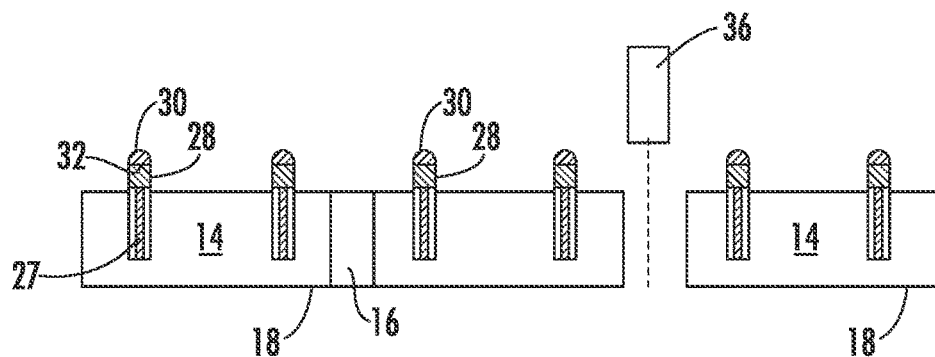
Figure 1D:
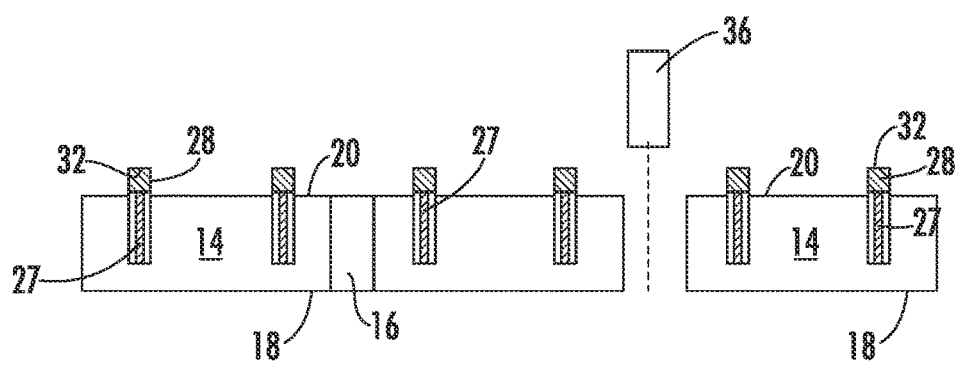

FIGS. 1C and 1D show semiconductor wafer 10 can be singulated through gaps or saw streets 16 using laser grooving, a saw blade, dry etch plasma dicing process, or laser cutting tool 36, or both to singulate the semiconductor wafer 10 into individual components 14 with electrical interconnect structures 28. The components 14 can then be used as part of a subsequently formed semiconductor component package as discussed in greater detail below with respect to FIGS. 2A-2I. FIGS. 1C and 1D differ by the inclusion or exclusion of a solder bump or bump 30 on an end or tip 32 of the conductive interconnect 28. As illustrated in FIG. 1C, in some instances the solder bump 30 may be included for subsequent flip chip mounting. As illustrated in FIG. 1D, in some instances the solder bump 30 may be omitted and subsequent flip chip mounting may be accomplished without solder.

Figure 2A:
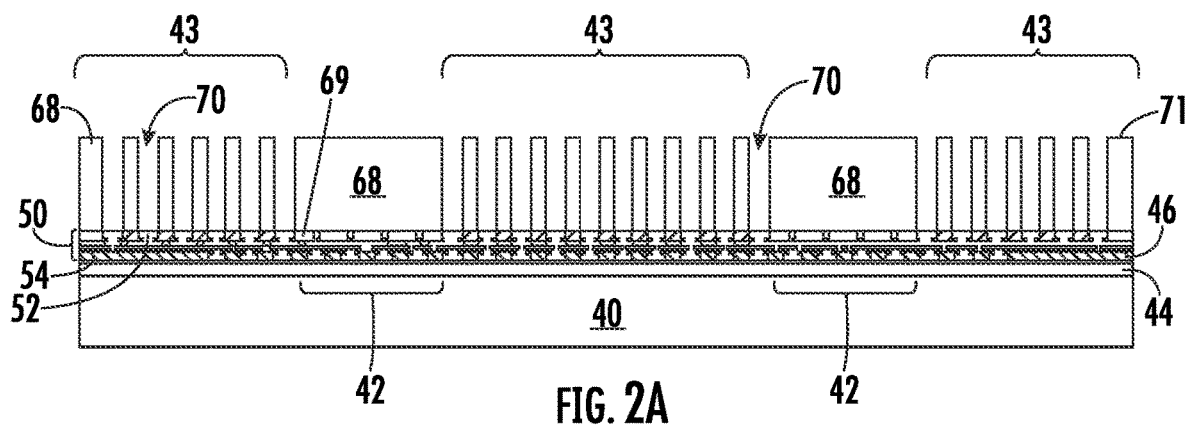

FIG. 2A illustrates providing a carrier, substrate, or temporary carrier 40, on which subsequent processing of the semiconductor devices, semiconductor component packages, or fully-molded interposer module or packages 130 can occur, as described in greater detail herein.

Carrier 40 may be a temporary or sacrificial carrier or substrate, and in other instances may be or a reusable carrier or substrate. The carrier 40 can contain one or more base materials formed in one or more layers, which may comprise base materials such as metal, silicon, polymer, polymer composite, ceramic, perforated ceramic, glass, glass epoxy, stainless steel, mold compound, mold compound with filler, or other suitable low-cost, rigid material or bulk semiconductor material for structural support. When a UV release is used with a temporary carrier 40, the carrier 40 may comprise one or more transparent or translucent materials, such as glass. When a thermal release is used with a temporary carrier 40, the carrier 40 may comprise opaque materials. The carrier 40 can be circular, square, rectangular, or other suitable or desirable shape and can include any desirable size, such as a size equal to, similar to, or slightly larger or smaller than a reconstituted wafer or panel that is subsequently formed on or over the carrier 40. In some instances, a diameter, length, or width of the temporary carrier can be equal to, or about, 200 millimeters (mm), 300 mm, 600 mm or more.

When a temporary carrier 40 is used, an optional release layer, interface layer or double-sided tape 44 can be formed over carrier 40 as a temporary adhesive bonding film or etch-stop layer. The release layer 40 may be a film or laminate, and may also be applied by slit or slot die coating, spin coating, or other suitable process. The temporary carrier can be subsequently removed by strip etching, chemical etching, mechanical peel-off, CMP, plasma etching, thermal, light releasing process, mechanical grinding, thermal bake, laser scanning, UV light, or wet stripping. While the release layer 44 is shown in FIG. 2A, for convenience and simplicity, the optional release layer 44 has been omitted from subsequent FIGS., although a person of ordinary skill will understand that the release layer 44 can remain and be present in processing shown in the other FIGS.

FIG. 2A also shows forming a seed layer 46 over the carrier 40 and the release layer 44, when present, so that the seed layer 46 can be in direct contact with the surface of the carrier 40, or in direct contact with the release layer 44, when present. The seed layer 46 can be one or more layers of Al, Cu, Sn, Ni, Au, Ag, Titanium (Ti), Tungsten (W) or other suitable electrically conductive material. In some instances, the seed layer 46 will be, or may include, Ti/Cu, TiW/Cu, W/Cu or a coupling agent/Cu. The formation, placement, or deposition of the seed layer 46 can be with PVD, CVD, electrolytic plating, electroless plating, or other suitable process. The seed layer 46 can be deposited by sputtering, electroless plating, or by depositing laminated foil, such as Cu foil, combined with electroless plating.

FIG. 2A illustrates forming a first build-up interconnect structure 50 over carrier 40 and seed layer 46. The build-up interconnect structure 50 may be formed to electrically connect, and provide routing with respect to, subsequently formed conductive interconnects 22 and embedded components 14.

The build-up interconnect structure 50 comprises one more layers of alternating conductive layers 52 and insulating layers 54, such as 2-8 alternating conductive or routing layers. However, a person of ordinary skill in the art will appreciate that fewer layers or more layers can be used depending on the configuration and design of the semiconductor device 130. The build-up interconnect structure 50 can optionally comprise one or more insulating or passivation layers 52 formed or disposed over the carrier 40. The first (and subsequent) insulating layers 52 can comprise one or more layers of $SiO_2$, $Si_3N_4$, SiON, $Ta_2O_5$, $Al_2O_3$, polymer, polyimide, BCB, PBO, or other material having similar insulating and structural properties. The insulating layer 52 can be formed using PVD, CVD, printing, spin coating, slit or slot die coating, spray coating, sintering or thermal oxidation. Openings or conductive vias can be formed through the insulating layers 52 over the conductive interconnects 52 and for other desired electrical connections. In other words, conductive vias or vertical electrical interconnects may be formed as part of the build-up interconnect structure 50 (and more specifically, e.g., the first conductive layer 54 as described below) may form electrical interconnects through the insulating layers 52.

The first conductive layer 54 can be formed over the carrier 40, and over the first insulating layer 52, as a first RDL layer to extend through the openings in the first insulating layer 52, or to otherwise electrically connect with the conductive interconnects 72. In some instances, the first conductive layer 54 may be formed directly on the seed layer 46, the release layer 44, or the carrier 40. Conductive layer 54 can be one or more layers of Al, Cu, Sn, Ni, Au, Ag, or other suitable electrically conductive material formed using a patterning and metal deposition process such as sputtering, electrolytic plating, and electroless plating, or other suitable process. A desired number of alternating insulating layers 52 and conductive layers 54 can be built for form the desired routing, according to the configuration and design of the semiconductor device 130.

FIG. 2A also shows forming or depositing a resist layer or photosensitive layer 68 over the temporary carrier 40. After formation of the resist layer 68 over the temporary carrier, the resist layer 68 can then be exposed and developed to form openings 70 in the resist layer 68. In some instances, more than one photoresist layer 68, such as a first photoresist layer 68a and a second photoresist layer 68b may be used. Openings 70 may be formed in the photoresist 68, and can be positioned over, or within a footprint of, the peripheral area 43 of the carrier 40. The openings 70 can extend completely through the resist layer 68, such as from a first surface or bottom surface 69 of the resist layer 68 to second surface or top surface 71 of the resist layer 68 opposite the first surface 69. An after development inspection (ADI) of the developed resist layer 68 and the openings 70 can be performed to detect the condition or quality of the openings 70. After the ADI of resist layer 68 and openings 70, a descum operation can be performed on the developed resist layer 68.

Figure 2B:
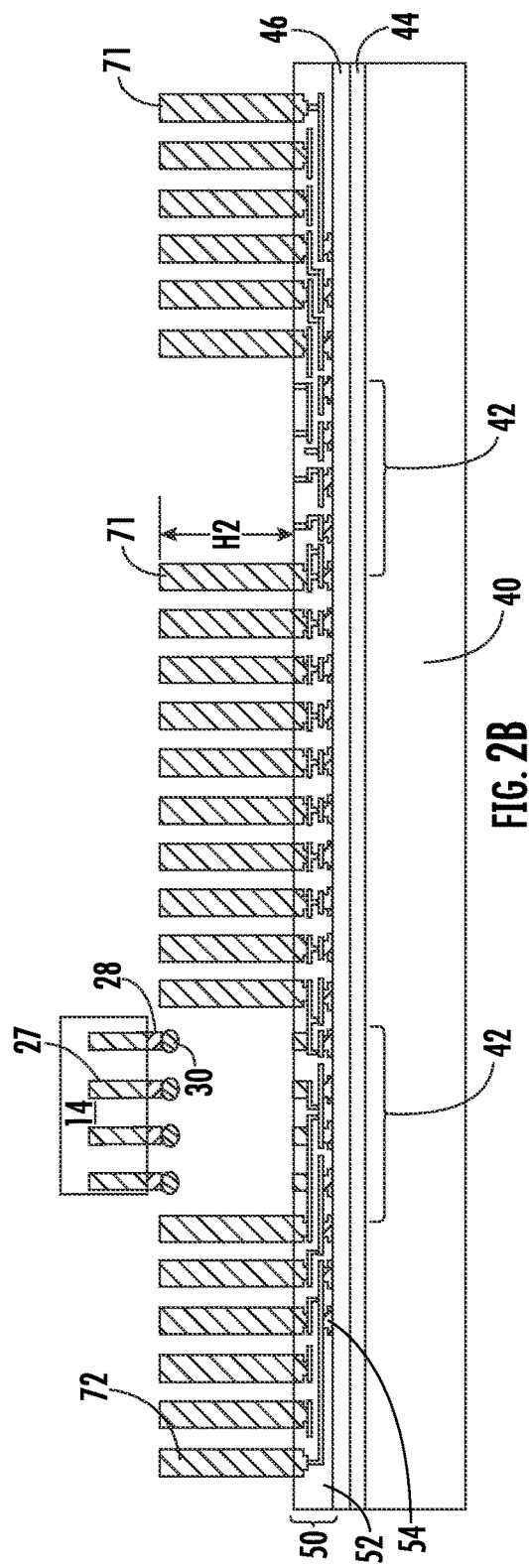

FIG. 2B shows the formation of a plurality of conductive interconnects 72 within the resist layer 68 that can be formed as columns, pillars, posts, bumps, or studs that are formed of copper or other suitable conductive material.

The conductive interconnects 72 can be formed using patterning and metal deposition processes such as printing, PVD, CVD, sputtering, electrolytic plating, electroless plating, metal evaporation, metal sputtering, or other suitable metal deposition process. When conductive interconnects 72 are formed by plating, the seed layer 46 can be used as part of the plating process. Conductive interconnects of posts 72 can be one or more layers of Al, Cu, Sn, Ni, Au, Ag, Pd, solder, or other suitable electrically conductive material and can include one or more layers.

After formation of the conductive interconnects 72, the resist layer 68 can be removed, such as by a stripping process, leaving conductive interconnects 72 in the peripheral area 43 around embedded component or semiconductor die mounting sites 42 to provide for subsequent vertical or three dimensional (3D) electrical interconnection for the semiconductor devices 130. Conductive interconnects 72 can include a height H2 in a range of 25-300 µm, or a height thereabout. As used herein, "thereabout," "about," or "substantially" means a percent difference in a range of 0-5%, 1-10%, 1-20%, or 1-30% (review height specs). For thin applications, conductive interconnects 72 can include a height H2 in a range of, 151-300 µm. For very thin applications, conductive interconnects 72 can include a height H2 in a range of, 70-150 µm. For ultra thin applications, conductive interconnects 72 can include a height H2 in a range of, 25-75 µm.

After removal of the resist layer 68, the semiconductor die mounting sites 42 on or over the temporary carrier 40 can be exposed and ready to receive the component 14 (which may include an active device, a semiconductor die comprising an active surface formed at the first surface, an IPD, an IPD die, or a passive device). The orientation of the embedded component 14 may be face down with the electrical interconnect structure 28 oriented towards the carrier 40 to which the embedded component 14 are mounted with solder bump 30, such as by being flip chip mounted.

Alternatively, preformed conductive vertical interconnects 72 may be formed away from the carrier 40, may be placed over the carrier 40 after formation, such as with a pick and place operation. In some instances, the conductive vertical interconnects 72 may be part of larger frame (whether integrally or separately formed with the conductive vertical interconnects) with connecting members to maintain a desired spacing or position of the conductive vertical interconnects. The conductive vertical interconnects 72 may be in contact with, surrounded by, or encapsulated or molded with a single encapsulant or mold compound 76 at a single step that is the same as the encapsulant 76 disposed around the embedded component 14.

Figure 2C:
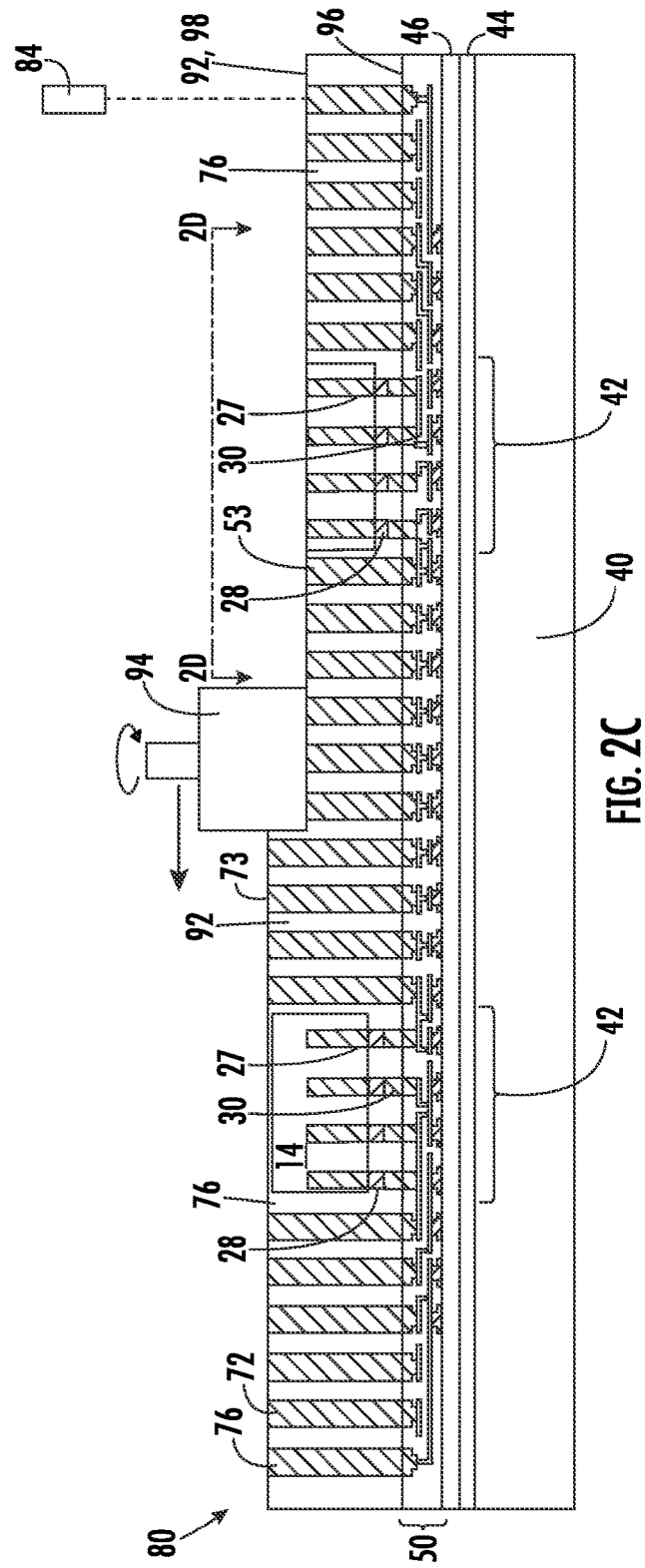
Figure 2D:
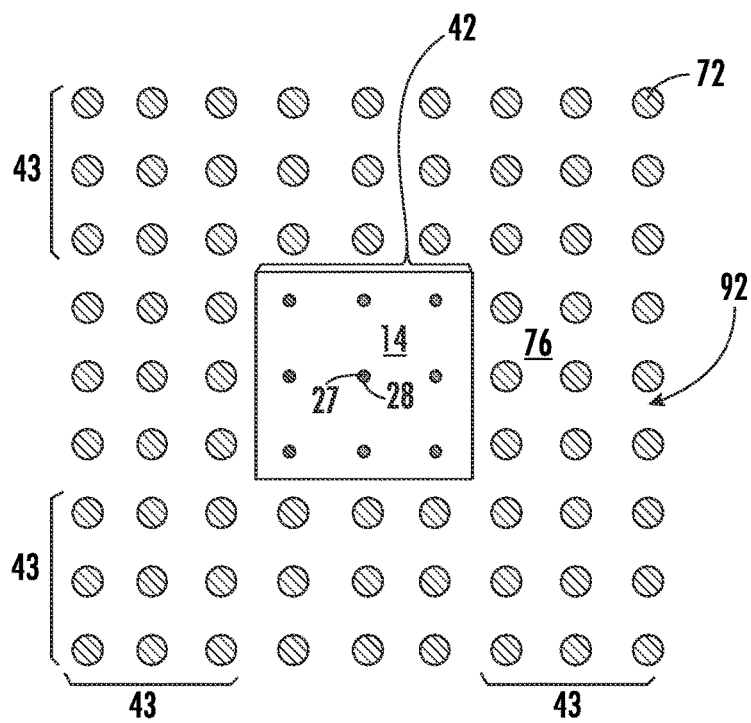

FIG. 2C shows that after mounting the component or embedded component 14 to the carrier 40 and to the build-up interconnect structure 50, a mold compound or encapsulant 76 can be deposited around the plurality of embedded component 14 and the conductive interconnects 72 using a paste printing, compression molding, transfer molding, liquid encapsulant molding, lamination, vacuum lamination, spin coating, slit or slot die coating, or other suitable applicator. The mold compound 76 can be a polymer composite material, such as epoxy resin with filler, epoxy acrylate with filler, or polymer with proper filler. Component or embedded component 14 can be embedded in mold compound 76, which can be non-conductive and environmentally protect the embedded component 14 from external elements and contaminants. The mold compound 76 can be formed adjacent to and directly contact all lateral sides of the embedded component 14 (such as four sides), as well as be formed over the active surface 20 ($5^{th}$ side) of the embedded component 14 (with or without an intervening RDL). The mold compound 76 can also be formed around and directly contact the sides of the electrical interconnects 28 and the conductive interconnect structures 72 to form a reconstituted panel, reconstituted wafer, molded panel, or molded wafer 80.

The reconstituted panel 80 can optionally undergo a curing process or post mold cure (PMC) to cure the mold compound 76. In some instances, a top surface, front surface, or first surface 92 of the mold compound 76 can be substantially coplanar with first end 73 of the conductive interconnects 72. Alternatively, the top surface 92 of the mold compound 76 can be over, offset, or vertically separated from the first ends 73 of the conductive interconnects 72, such that the first ends 73 of the conductive interconnects 72 are exposed with respect to the encapsulant 76 after the reconstituted wafer 80 undergoes a grinding operation.

The reconstituted panel 80 can also undergo an optional grinding operation with grinder 94 to planarize the top surface, front surface, or first surface 98 of the reconstituted panel 80 and to reduce a thickness of the reconstituted panel 80, and to planarize the top surface 92 of the mold compound 76 and to planarize the top surface 98 of the reconstituted panel 80. The top surface 98 of the reconstituted panel 80 can comprise the top surface 92 of the mold compound 76, the first ends of the conductive interconnects 72, or both. A chemical etch can also be used to remove smear, such as Cu smear, from the encapsulant, EMC, or mold compound 76 and the reconstituted panel 80 that results from the grinding. The chemical etch may cause the metal or Cu of the TSVs 27 to be recessed (or slightly non-planar) with respect to the top surface 96 of the encapsulant 76, such as in a range of about 50 to 500 nanometers. In other words, the grinding step may make the copper and encapsulant 76 planar, while the etch results in some minor non-planarity, or results in the TSVs 27 being substantially planar with the EMC. Thus, the top surface 98 of the conductive interconnects 72 can be exposed with respect to mold compound 76 in the peripheral area 43 to provide for electrical connection between embedded component 14 and a subsequently formed redistribution layer or build-up interconnect structure 100.

The reconstituted wafer 80 can also undergo a panel trim or trimming to remove excess mold compound 76 that has remained in undesirable locations as a result of a molding process, such as eliminating a flange present for a mold chase. The reconstituted panel 80 can include a footprint or form factor of any shape and size including a circular, rectangular, or square shape, the reconstituted wafer 80 comprising a diameter, length, or width of 200 millimeter (mm), 300 mm, 600 mm, or any other desirable size.

Actual positions of the embedded component 14 within the reconstituted panel 80 may be measured with an inspection device or optical inspection device 84. As such, subsequent processing of the fully molded panel 80 as shown and described with respect to subsequent FIGS. can be performed with respect to the actual positions of the embedded component 14 within the reconstituted panel 80.

FIG. 2D shows a top or plan view of a portion of the reconstituted wafer 80 and the conductive interconnects 72 shown in a view perpendicular to that of FIG. 2C, and as taken along the section line 2D from FIG. 2C. FIG. 2D illustrates that the conductive interconnects 72 can be formed within, and extend intermittently across, the peripheral area 43 and surround the embedded component mounting sites 42 without being formed within the embedded component mounting sites 42.

Figure 2E:
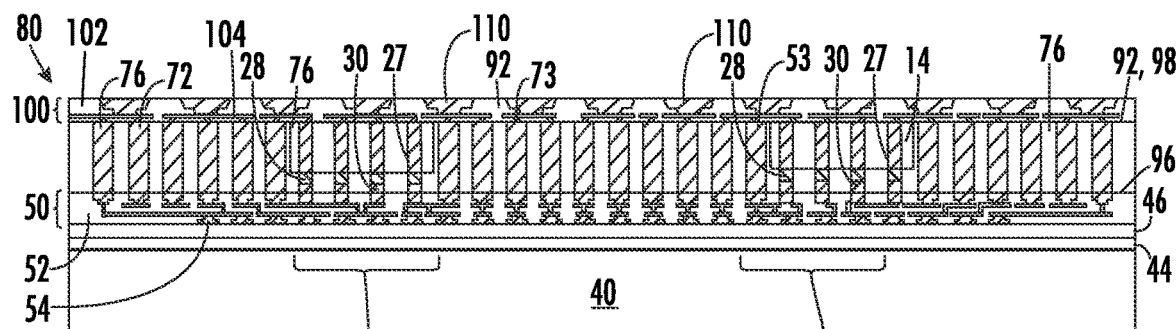

FIG. 2E shows forming a build-up interconnect structure 100 over the molded panel 80 to electrically connect, and provide routing between, conductive interconnects 72 and the embedded components 14. While the build-up interconnect structure 100 is shown comprising two conductive layers and three insulating layers, a person of ordinary skill in the art (POSA) will appreciate that fewer layers or more layers can be used depending on the configuration and design of the semiconductor device 130. The build-up interconnect structure 100 can optionally comprise a first insulating or passivation layer 102 formed or disposed over the reconstituted panel 80. The first insulating layer 102 can comprise one or more layers of $SiO_2$, $Si_3N_4$, SiON, $Ta_2O_5$, $Al_2O_3$, polymer, polyimide, BCB, PBO, or other material having similar insulating and structural properties. The insulating layer 102 can be formed using PVD, CVD, printing, spin coating, slit or slot die coating, spray coating, sintering or thermal oxidation. Openings or first level conductive vias can be formed through the insulating layer 102 over the conductive interconnects 72 and the IPD TSV 27 to connect with the embedded component 14. In other words, conductive vias formed as part of the build-up interconnect structure 100 (and more specifically, e.g., the first conductive layer 104 as described below) may form the second electrical interconnect structure coupled to a second end of the TSVs 27 at the second surface of the embedded device, to provide vertical electrical through interconnect for the embedded component 14.

The first conductive layer 104 can be formed over the reconstituted panel 80 and over the first insulating layer 102 as a first RDL layer to extend through the openings in the first insulating layer 102, to electrically connect with the first level conductive vias, and to electrically connect with conductive interconnects 72 and IPD TSV 27. Conductive layer 104 can be one or more layers of Al, Cu, Sn, Ni, Au, Ag, or other suitable electrically conductive material formed using a patterning and metal deposition process such as sputtering, electrolytic plating, and electroless plating, or other suitable process. In other words, the second electrical interconnect structure comprises a portion of a conductive RDL layer filling a via through dielectric via as part of a build-up interconnect structure such that the second electrical interconnect structure is formed at, and directly contacts, the second end of the TSV.

A second insulating or passivation layer 106, which can be similar or identical to the first insulating layer 102, can be disposed or formed over the reconstituted panel 80, the first conductive layer 104, and the first insulating layer 102. An opening or second level conductive via can be formed through the second insulating layer 106 to connect with the first conductive layer 104, and in some instances could also be used to connect with the TSVs 27.

A second conductive layer or UBMs 110 can be formed over the second insulating layer 106 and the second level conductive via to electrically connect with the other conductive layers and conductive vias within the build-up interconnect structure 100, as well as electrically connect to the embedded component 14, the IPD TSV 27, and the conductive interconnects 72. UBMs 110, like all of the layers, plating layers, or conductive layers formed by a plating process as presented herein, can be a multiple metal stack comprising one or more of an adhesion layer, barrier layer, seed layer, or wetting layer. The adhesion layer can comprise titanium (Ti), or titanium nitride (TiN), titanium tungsten (TiW), Al, or chromium (Cr). The barrier layer can be formed over the adhesion layer and can be made of Ni, NiV, platinum (Pt), palladium (Pd), TiW, or chromium copper (CrCu). In some instances, the barrier layer can be a sputtered layer of TiW or Ti and can serve as both the adhesion layer and the barrier layer. In either event, the barrier layer can inhibit unwanted diffusion of material, like Cu. The seed layer can be Cu, Ni, NiV, Au, Al, or other suitable material. For example, the seed layer can be a sputtered layer of Cu comprising a thickness of about 2000 angstroms (e.g., 2000 plus or minus 0-600 angstroms). The seed layer can be formed over the barrier layer and can act as an intermediate conductive layer below subsequently formed bumps, balls, or interconnect structures 120 (Cu pilar bump with SnAg cap). In some instances, the wetting layer can comprise a layer of Cu with a thickness in a range of about 5-11 µm or 7-9 µm. Bumps 120, such as when formed of SnAg solder, can consume some of the Cu UBM during reflow and forms an intermetallic compound at the interface between the solder bump 120 and the Cu of the wetting layer. However, the Cu of the wetting layer can be made thick enough to prevent full consumption of the Cu pad by the solder during high temperature aging. In some instances, the seed layer and the wetting layer can be a single layer (similar to the adhesion layer and the barrier layer being formed as a single layer. Therefore, just two layers may be used; a Ti (adhesion+barrier layer) comprising a thickness in a range of about 200 to 1,000 angstroms and a Cu (seed+wetting layer) with a thickness in a range of about 500 to 5,000 angstroms.

UBMs 110 may be formed as a PoP UBM pad, UBM structure, or land pad, such as for stacked PoP structure, an additional electronic component, as well as for a surface mount structure (or copper pillar bump) 114, such as any active or passive semiconductor devices, chip, or integrated circuit passive device, including, e.g., a capacitor. In some instances, the UBMs 110 can comprise Ni, Pd and Au. UBMs 110 can provide a low resistive interconnect to build-up interconnect structure 100 as well as a barrier to solder diffusion and seed layer for solder wettability.

Figure 2F:
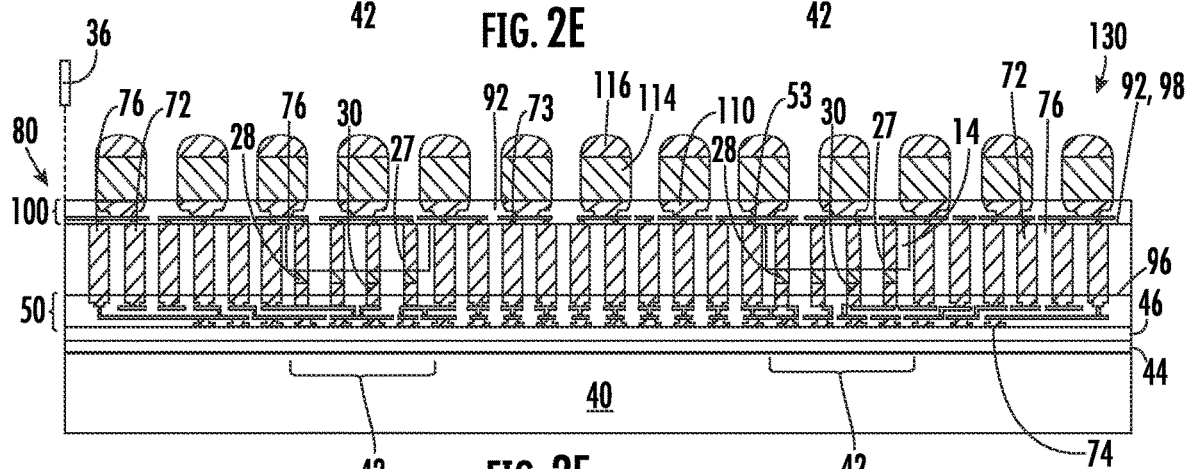

FIG. 2F shows an example of Cu pillar bump 114 with SnAg solder bump 116 plated on top, such as a copper pilar bump with SnAg cap. Bumps, conductive bumps, balls, or interconnect structures 114 can be formed on or coupled to the build-up interconnect structure 100. The bumps 116 can be configured to couple the semiconductor device 130 with other devices, such as mounting the conductive bumps 114, 116 of the semiconductor device 130 to a printed circuit board (PCB) 126. Wherein the conductive bumps 114, 116 comprise one or more of an input electrical contact, an output electrical contact, an i/o contact, a bump, a solder ball, a solder bump, a BGA, a LGA, land pads, copper pillars, and copper pillars with solder. The bumps 114, 116 can be formed by depositing an electrically conductive bump material over the surface to which they will be attached using an evaporation, electrolytic plating, electroless plating, ball drop, or screen-printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be bonded using a suitable attachment or bonding process. In one embodiment, the bump material is reflowed by heating the material above its melting point to form spherical balls or bumps 114, 116. In some applications, bumps 114, 116 are reflowed a second time to improve electrical contact to the build-up interconnect structure 114, 116. The bumps 114, 116 can also be compression bonded or thermocompression bonded. Bumps 114, 116 represent one type of interconnect structure that can be formed, and other desirable structures, such as conductive paste, stud bump, micro bump, or other electrical interconnects may also be used as desired.

FIG. 2F illustrates removing the temporary carrier 40, to expose a UBM 74, or a portion of the first build-up interconnect structure 50. The carrier 40 can be removed, e.g., by grinding the carrier 40, by exposing UV release tape 44 to UV radiation separate the UV tape 44 from the glass substrate 40, by thermal release, by laser ablation, or other suitable method. After removal of the carrier 40, the reconstituted panel 80 can also undergo an etching process, such as a wet etch, to clean the surface of the reconstituted panel 80 exposed by removal of the temporary carrier 40, including the exposed UBM 74 of the Cu post Module. The exposed second ends 75 of the conductive interconnects 72, if exposed, can also undergo a coating or pad finishing process, such as by an Organic Solderability Preservative (OSP) coating, solder printing, electroless plating, or other suitable process, to form a PoP UBM pad, UBM structures, land pads, or other suitable structure, as desired, FIG. 2F also illustrates the reconstituted panel 80 can be singulated through gaps or saw streets using laser grooving, a saw blade or laser cutting tool 36, or both to singulate the reconstituted panel 80 into individual semiconductor devices 130.

Figure 2G:
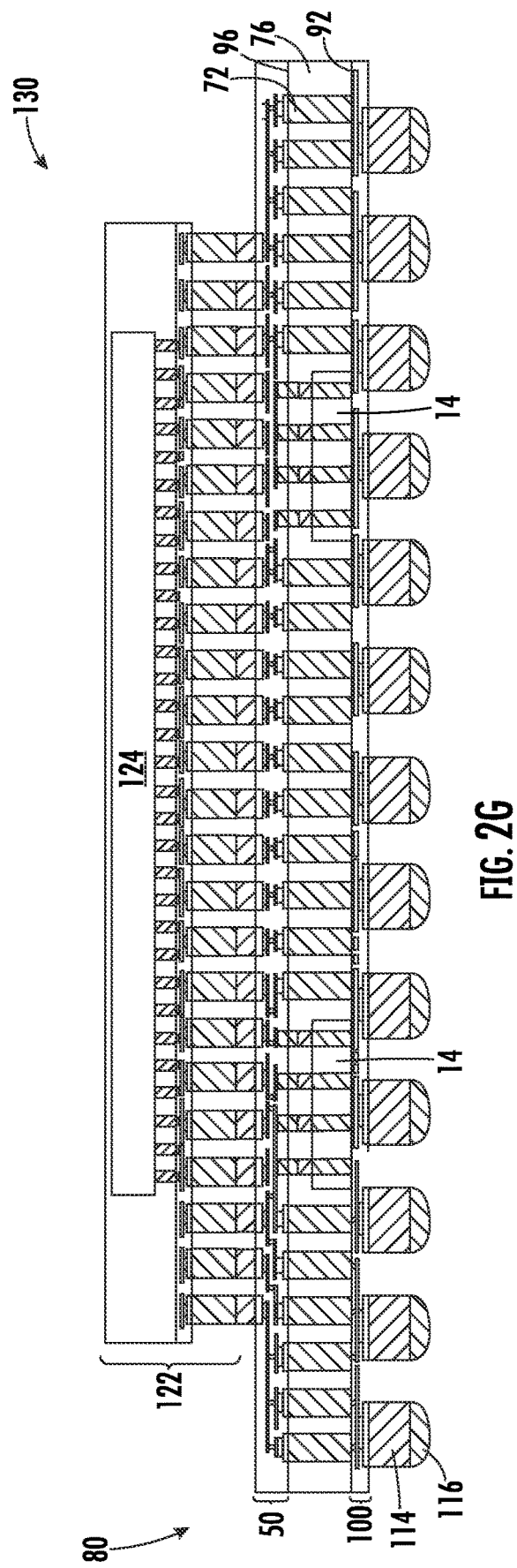

FIG. 2G, continuing from FIG. 2F, illustrates the singulated semiconductor device 130 flipped upside-down and the mounting of a semiconductor device or SoC 122 to the semiconductor device 130 by BGA mounting to UBM 74. The SoC 122 may comprise a large semiconductor die 124, such as memory device, microprocessor, artificial intelligence (AI) processor, networking processor, graphics processor, analog device, clock, or other semiconductor device.

FIG. 2H shows a cross-sectional profile view of a final semiconductor device 130, similar to the view shown in FIG. 2F, but with the view in FIG. 2H shown with the features of the device 130 more closely to scale, and coupled to the PCB 126.

FIG. 2I illustrates a close-up or enlarged view of a portion of the semiconductor device 130 indicated by the section line 2I in FIG. 2H, to provide additional detail of exemplary measurements.

Both FIGS. 2G and 2H show the peripheral conductive interconnect structures 72 disposed around, and laterally offset from, the embedded component 14 and within the encapsulant material 76. The peripheral conductive interconnect structures 72, like the TSVs 27, can extend completely through the encapsulant 76 in a vertical direction from the top surface 92 of the encapsulant 76 to, or adjacent, the bottom surface 96 of the encapsulant 76 opposite top surface 92 to provide vertical electrical interconnection through the semiconductor device 130, which can facilitate stacking of packages in PoP arrangements. As shown in FIG. 2H, the semiconductor device 130 may comprise the embedded devices with TSVs encapsulated and coupled to (or sandwiched between) one or more of: (i) an upper the semiconductor die (which may include a system on a chip (SoC) 122, memory device, microprocessor, graphics processor, analog device (e.g. power management IC), clock, phase-lock loop or any desired semiconductor device) through a redistribution layer (RDL); and (ii) a lower laminated substrate, PBC, or other desired substrate 126. Further, the dimensions shown in the FIGS., such as FIG. 2H shows about what dimension could be, and as such provide illustrations of non-limiting examples.

FIG. 3A shows a cross-sectional profile view of a final semiconductor device 130, similar to the view shown in FIG. 2H, but comprising 90 μm pitch interposer 80 with 90 μm SoC 122 and 90 μm IPD 14 added chip last. FIG. 3B illustrates a close-up or enlarged view of a portion of the semiconductor device 130 indicated by the section line 3B in FIG. 3A, to provide additional detail of exemplary measurements.

FIGS. 4A-4L, 5A-5B, and 6A-6B, illustrate other aspects, instances, examples, or embodiments of the semiconductor device presented in FIGS. 1A-3B, but with some variation, including solderless interconnects on both opposing sides of the TSVs 27 and electrical interconnect structures 28 of embedded component 14. Like elements and features remain unchanged, and in the interest of brevity are not further repeated or duplicated in the subsequent descriptions.

Figure 4A:
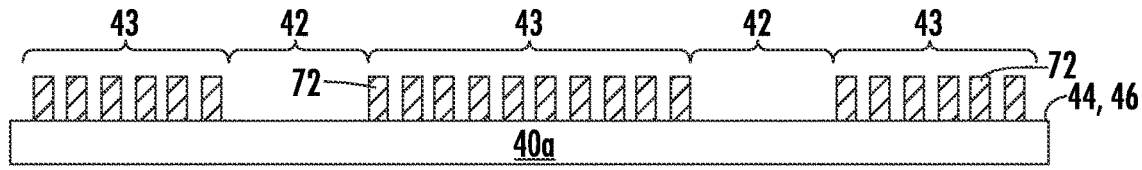

FIGS. 4A-4L illustrate another example of a method or sequence for manufacturing a fully molded interposer module 80, such as may be used with 3D PoP devices. FIG. 4A illustrates providing a first or backside temporary carrier 40a that may be similar or identical to temporary carrier 40 shown in FIGS. 2A and 2B. FIG. 4A further shows the formation of conductive interconnects 72, which may be similar or identical to conductive interconnects 72, which were shown and described with respect to FIGS. 2A and 2B.

Figure 4B:
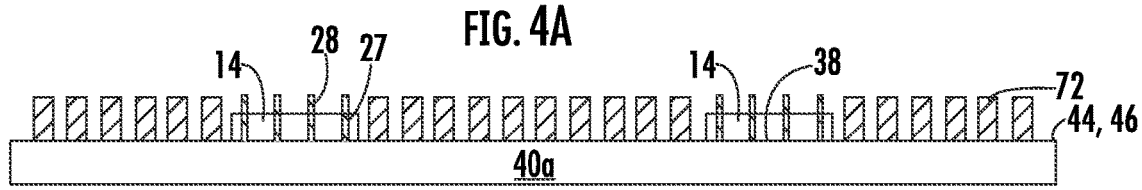

FIG. 4B, illustrates the placement of embedded devices 14 in a face-up orientation, or with a backside of the embedded devices being oriented towards, and coupled to, the backside temporary carrier. The embedded devices 14 may be similar or identical to the embedded devices 14 shown in FIGS. 1A-1C and 2A. The embedded devices 14 may differ from the embedded device 14 by being formed with TSV that do not comprise, or are not coupled with, conductive bumps or solder bumps, which may be advantageously used when coupling the embedded device (such as to a conductive pad or a portion of a build-up interconnect structure) in a face down position, as shown in in FIG. 2B. Additionally, being mounted with their backsides 38 to the backside carrier 40a, a die attach film (DAF) 38 may be used.

Figure 4C:
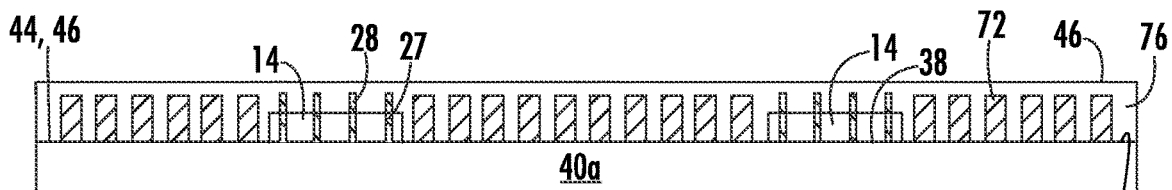

FIG. 4C, continuing from FIG. 4B, illustrates the formation of the interposer module by disposing an encapsulant or mold compound 76 over, around, and in contact with the embedded devices 14 to form a reconstituted panel 80. The mold compound 76 can be formed adjacent to and directly contact all lateral sides of the embedded component 14 (such as four sides), as well as be formed over the active surface 20 ($5^{th}$ side) of the embedded component 14 (with or without an intervening RDL). The mold compound 76 can also be formed around and directly contact the sides of the electrical interconnects 28 and the conductive interconnect structures 72 to form a reconstituted panel, reconstituted wafer, molded panel, or molded wafer 80.

Figure 4D:
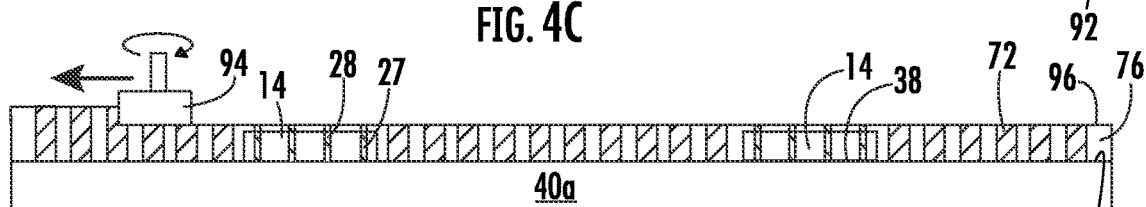

FIG. 4D, continuing from FIG. 4C, illustrates the reconstituted panel 80 may undergo a grinding or planarization operation to reveal or expose the conductive interconnects 28 coupled to the TSVs 27 of the embedded devices 14, as well as reveal or expose the conductive interconnects 72 in the periphery 43 of the embedded devices 14. The grinding or removal operation may be similar to that described with respect to FIG. 2C with grinder 94, but be over the active surface or front side 20 of the embedded component 14, rather than the backside 18 as shown in FIGS. 2C and 4I. The grinding may comprise one or more of: grinding, plasma etching, wet chemistry etching, or other chemical or mechanical process.

Figure 4E:
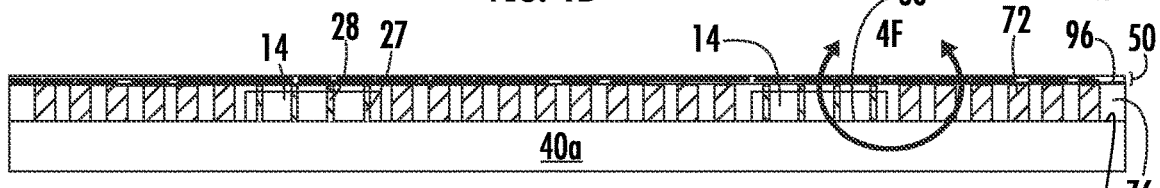

FIG. 4E, continuing from FIG. 4D, illustrates a build-up interconnect structure 50 being formed over the reconstituted panel 80. Because the embedded devices are mounted face up and the electrical interconnects 28 coupled to the TSVs 27 of the embedded device 14 are exposed from the encapsulant 76, the embedded devices 14 may be coupled to the build-up interconnect structure 50 without solder bumps or solder interconnects. Advantages of coupling the embedded device 14 to the build-up interconnect structure 50 include: (i) a "cleaner" or improved signal path with less signal degradation and higher signal integrity, (ii) no intermetallic layers present that form at the TSV-solder interface that result from the copper solder interactions, and (iii) removes and additional layer of building land pads or other pads for receiving the solder bumps or solder interconnects, which both reduces the number of layers in the final interposer or device, which also reduces the cost of manufacturing or producing the same.

FIG. 4F, illustrating a close-up view of a portion of FIG. 4E, illustrating that the TSVs 27 may extend partially, but not completely, through the embedded component 14.

FIG. 4G, continuing from FIGS. 4E and 4F, illustrates the attachment of a frontside carrier 40b over the frontside build-up interconnect structure 50. The frontside carrier 40b may be similar or identical to the backside carrier 40a.

FIG. 4H illustrates a view of the structure shown in FIG. 4G, but having been inverted or flipped over from the view of FIG. 4G, to facilitate further processing.

FIG. 4I illustrates the structure from FIG. 4H, but after the removal of the backside carrier 40a, such as by one or more of: grinding, plasma etching, wet chemistry etching, or other chemical or mechanical process. Removal of the backside carrier 40a may include, or be followed by, a planarization operation to reveal the TSVs 27 on the backside 18 of the embedded devices 14 at the same time revealing the conductive interconnects 72 and the encapsulant 76.

Figure 4J:
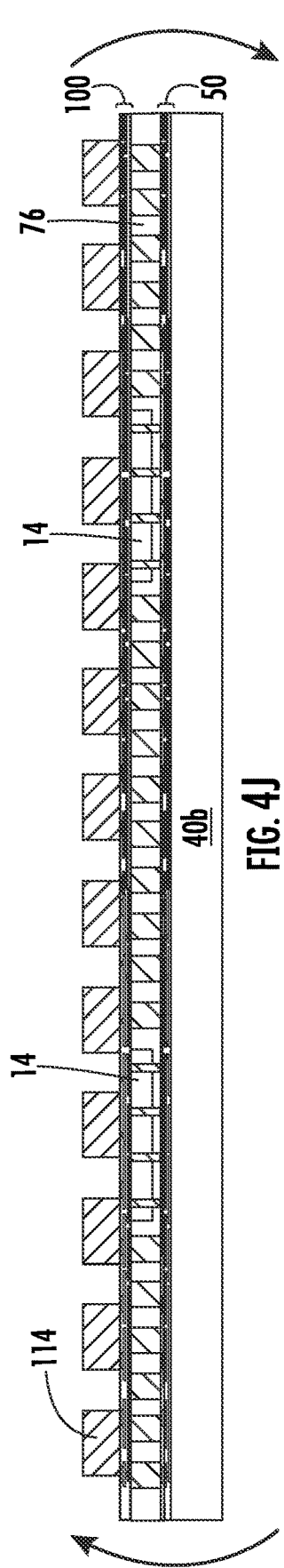

FIG. 4J illustrates the interposer module 80 undergoing the addition of bumps or Cu Pillar interconnects 114 coupled to the backside build-up interconnect structure 50 to facilitate subsequent interconnection, such as to a PCB, laminate substrate, or other substrate 126.

Figure 4K:
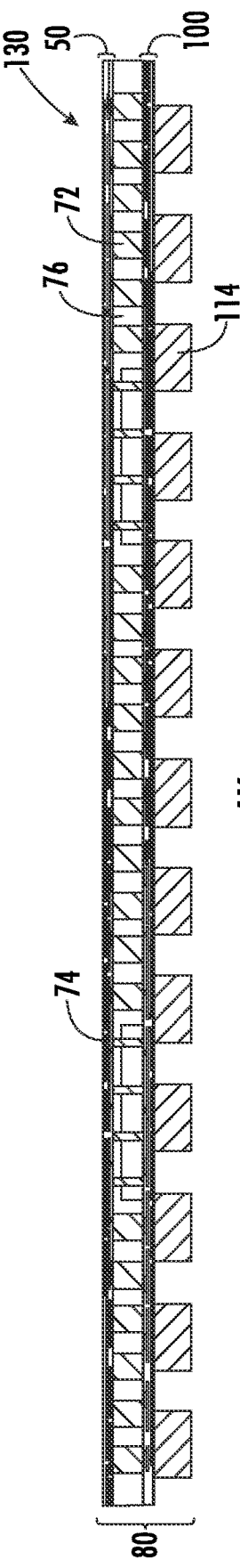

FIG. 4K illustrates the interposer from FIG. 4J having been inverted or flipped over from the view of FIG. 4J, to facilitate the removal and planarization of the frontside carrier 40b. Removal and planarization of the frontside carrier 40b may be achieved by one or more of: grinding, plasma etching, wet chemistry etching, or other chemical or mechanical process. Removal of the frontside carrier 40b may also allow for further interconnection.

Figure 4L:
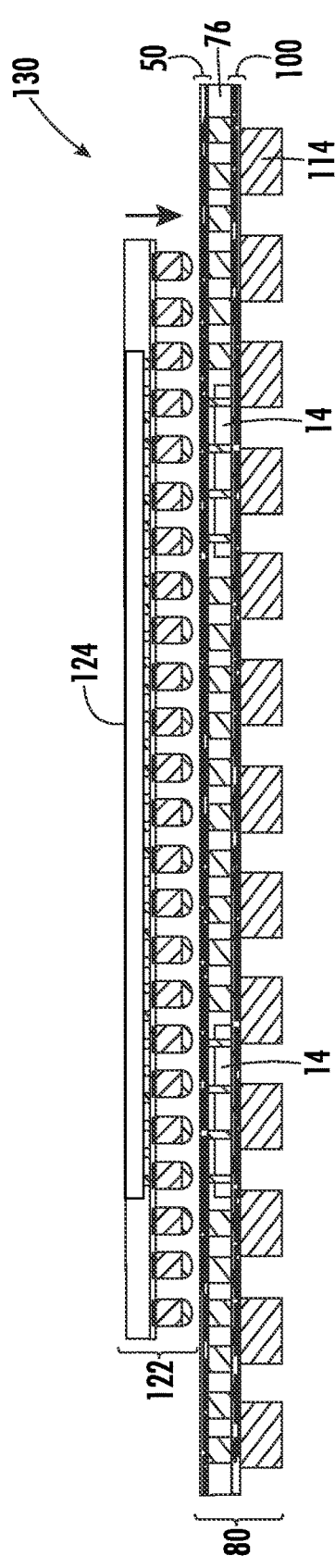

FIG. 4L, continuing from FIG. 4K, illustrates the fully molded interposer 80 from FIG. 4K receiving, or having added to it, one or more semiconductor die 124 over the frontside build-up interconnect structure 50. The semiconductor die 124 comprises one or more of a SoC, memory device, microprocessor, graphics processor, analog device, clock, or other semiconductor device 122. The addition of the one or more semiconductor die 124 over the frontside build-up interconnect structure 50 may form a 3D PoP module 130.

Figure 5A:
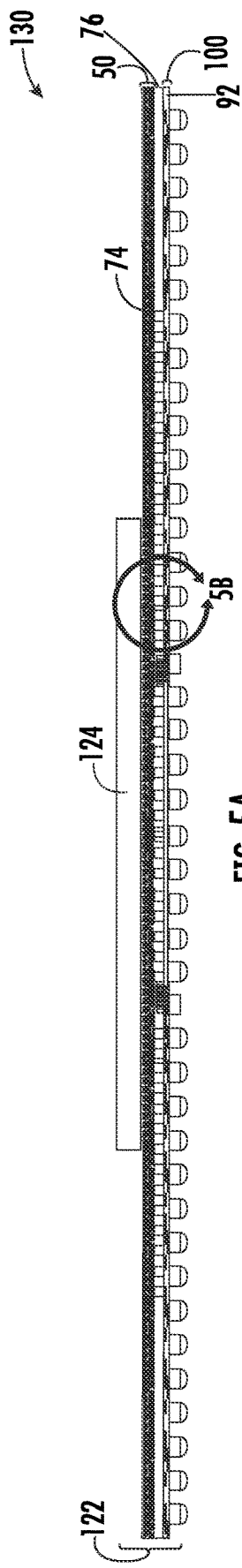
FIGS. 5A and 5B illustrate another aspect of a TSV interposer module.
Figure 5B:
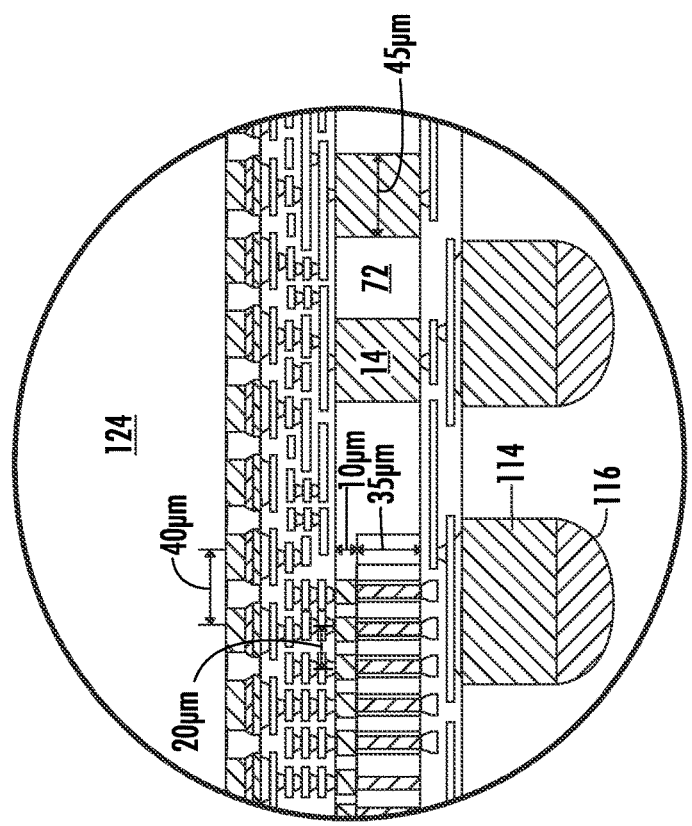

FIGS. 5A and 5B illustrate an embodiment of a solderless semiconductor device 130, similar to what was illustrated in FIG. 4L. Solderless semiconductor device 130 is illustrated with chip last SoC 122 and chip first IPD 14, comprising IPDs that have 20 μm pitch electrical interconnects with, or as, the embedded device 14, and flip chip SoC that has 40 μm pitch electrical interconnects 122. FIG. 5A shows roughly proportioned or scaled image of the chip last SoC 122. FIG. 5B shows close-up views of portions of the chip last SoC 122 with the embedded device 14 comprising TSVs 27, as taken along the section line 5B from FIG. 5A.

Figure 6A:
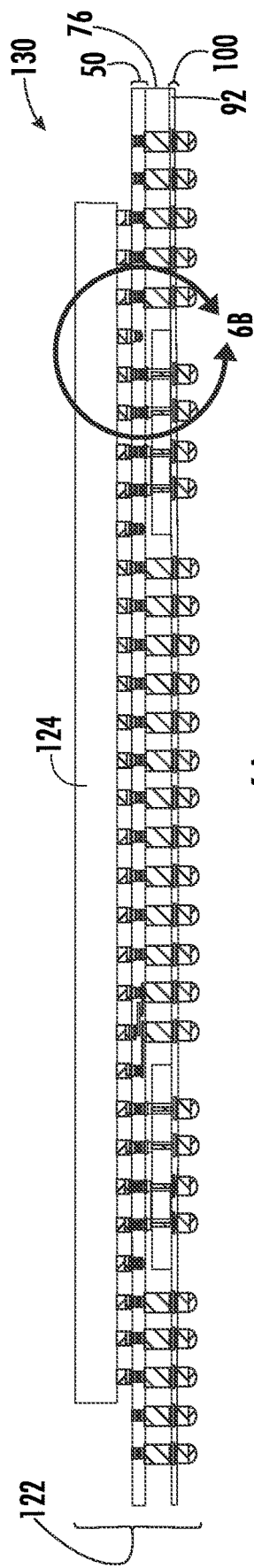
FIGS. 6A and 6B illustrate another aspect of a TSV interposer module.
Figure 6B:
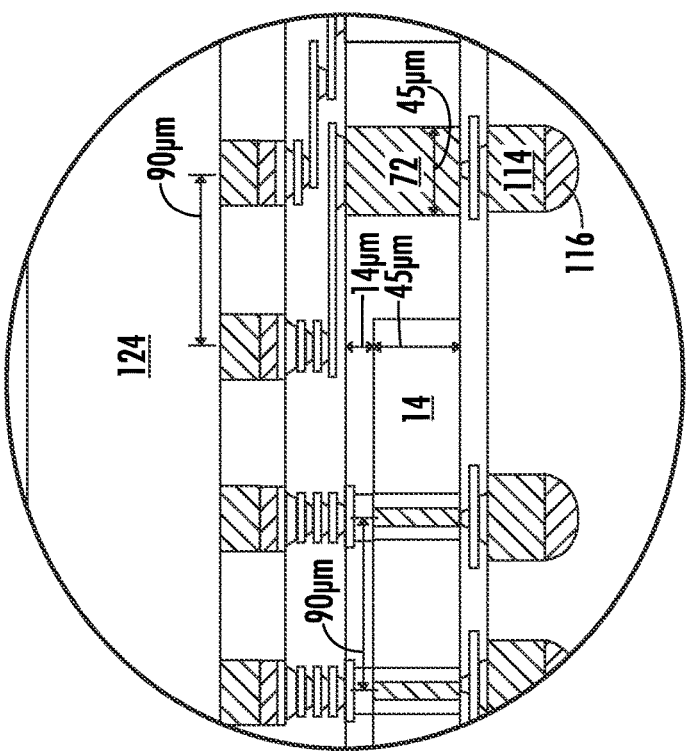

FIGS. 6A and 6B illustrate an embodiment of a solderless semiconductor device 130 comprising chip last SoC 122, and chip first IPD 14 comprising embedded IPDs that have 90 μm pitch electrical interconnects 14, and flip chip SoC that has 90 μm pitch electrical interconnects 122 with a 90 μm pitch carried throughout the semiconductor device 130. FIG. 6A shows roughly proportioned or scaled image of the semiconductor device 13.

FIG. 6B shows close-up views of portions of the chip last SoC 122 with the embedded device 14 comprising TSVs 27 as taken along the section line 6B from FIG. 6A.

The advantages shown and described herein, such as those shown in FIGS. 1A-6B include the disparate elements of TSVs and encapsulant, which have not been previously brought together as described herein. Conventionally wafer fabrication technology (front end packaging) and post fab packaging (back end packaging) have relied on separate, isolated, and differing practices. The bringing together of TSVs in an embedded device defies convention, breaks existing beliefs and paradigms, by bringing together different packaging processes into a new method, device, system, structure, and form. The current method and design broadens the idea that TSVS are strictly an integrated circuit (IC) technology, and challenges the notion that encapsulant or mold compound would not be used (as shown herein) in a wafer fab. To the contrary, the current semiconductor device is produced by fabrication inside the molded material or encapsulant, to provide an extension to the embedded device (chip). The new method and device advantageously provides relaxed pitch, such as for a BGA with a pitch greater than or equal to (≥) 90 μm, so as to allow mass reflow and lower a cost for substrates. The new method and device further advantageously provides high density and small form factor while eliminating potential yield loss for SoC designs, included those associated with a chips first process.

While this disclosure includes a number of embodiments in different forms, the particular embodiments presented are with the understanding that the present disclosure is to be considered as an exemplification of the principles of the disclosed structures, devices, methods, and systems, and is not intended to limit the broad aspect of the disclosed concepts to the embodiments illustrated. Additionally, it should be understood by those of ordinary skill in the art that other structures, manufacturing devices, and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art. As such, it will be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. A method of making a package, comprising:
providing a first temporary carrier comprising embedded component mount sites and a plurality of conductive interconnects disposed around the embedded component mount sites;
disposing an embedded component over the first temporary carrier, wherein the embedded component comprises through silicon vias (TSVs), wherein the embedded component comprises one or more of an active device, a semiconductor die comprising an active surface, an integrated passive device (IPD), a passive device, and a MEMs device;
disposing an encapsulant over the first temporary carrier, around at least five sides of the embedded component, and contacting four side surfaces of the embedded component;
forming a first build-up interconnect structure over the encapsulant and coupled to first ends of the TSVs;
providing a second temporary carrier opposite the first temporary carrier and over the first build-up interconnect structure;
removing the first temporary carrier;
forming a second build-up interconnect structure over and coupled to a second end of the TSVs;
removing the second temporary carrier; and
disposing a component, over and coupling the component to, the first build-up interconnect structure, wherein the component comprises a semiconductor die, system on chip (SoC), memory device, microprocessor, graphics processor, analog device, clock, MEMs, or other semiconductor device.

2. The method of claim 1, further comprising removing a portion of the encapsulant from over the first temporary carrier, the conductive interconnects, and the embedded component by a grinding process.

3. The method of claim 1, wherein the first build-up interconnect structure is coupled to the first ends of the TSVs with a portion of a conductive RDL layer filling a via and without conductive bumps or solder.

4. The method of claim 1, wherein a pitch of copper studs of the second build-up interconnect structure comprises the pitch being in a range of 50 µm-150 µm.

5. The method of claim 1, further forming the second electrical interconnect comprising a portion of a conductive RDL layer filling a via to directly contact the second end of the TSV.

6. A method of making a package, comprising:
providing an embedded component comprising through silicon vias (TSVs);
disposing an encapsulant around at least five sides of the embedded component, the encapsulant contacting four side surfaces of the embedded component;
forming a first build-up interconnect structure coupled to a first end of the TSV of the embedded component;
coupling a second build-up interconnect structure to a second end of the TSV of the embedded component; and
disposing a component over, and coupling the component to, the first build-up interconnect structure and the TSV, wherein the component comprises a semiconductor die, system on chip (SoC), memory device, microprocessor, graphics processor, analog device, clock, MEMs, or other semiconductor device.

7. The method of claim 6, wherein the embedded component further comprises one or more of an active device, a semiconductor die comprising an active surface, an integrated passive device (IPD), a passive device, or a MEMs.

8. The method of claim 6, further comprising:
forming a conductive stud formed at, and directly contacting, the first end of the TSV and the first electrical interconnect structure; and
forming the second electrical interconnect structure as a build-up interconnect structure that comprises a portion of a conductive RDL layer filling a via through a dielectric via to directly contact, the second end of the TSV.

9. The method of claim 6, further comprising electrically coupling the embedded component through the TSV to a semiconductor die mounted over the embedded component.

10. The method of claim 6, further comprising forming the first build-up interconnect structure over the encapsulant and coupled to first ends of the TSVs with solderless interconnects.

11. The method of claim 6, further comprising:
providing a second embedded component comprising TSVs, wherein the second embedded component is laterally offset from the embedded component;
disposing the encapsulant around at least five sides of the second embedded component, the encapsulant contacting four side surfaces of the second embedded component; and
wherein disposing the encapsulant around the embedded component and around the second embedded component occurs in a single encapsulating step.

12. The method of claim 6, further comprising disposing peripheral copper posts around the embedded component to facilitate package on package (PoP) stacking of multiple semiconductor packages.

13. A package, comprising:
an embedded component comprising through silicon vias (TSVs) extending from a first surface to a second surface opposite the first surface;
an encapsulant disposed around at least five sides of the embedded component, and the encapsulant contacts four side surfaces of the embedded component;
a first electrical interconnect structure comprising a conductive stud formed at, and coupled to, a first end of the TSV at the first surface of the embedded component, wherein the encapsulant contacts at least a portion of the side of the conductive stud; and a second electrical interconnect structure comprising a portion of a conductive RDL layer as part of a build-up interconnect structure, such that the second electrical interconnect structure is formed at, and coupled to, a second end of the TSV at the second surface of the embedded component.

14. The package of claim 13, wherein the encapsulant contacts the first surface of the embedded component.

15. The package of claim 13, wherein the embedded component comprises one or more of an active device, a semiconductor die comprising an active surface formed at the first surface, an integrated passive device (IPD), a passive device, or a MEMs.

16. The package of claim 13, further comprising:
a second embedded component comprising TSVs extending from a first surface to a second surface opposite the first surface, the second embedded component being laterally offset from the embedded component; and
the encapsulant formed as a single layer of encapsulant that is disposed around the embedded component and around at least five sides of the second embedded component, the encapsulant contacting four side surfaces of the second embedded component.

17. The package of claim 13, wherein the first electrical interconnect of the TSV directly contacts the embedded component without an RDL.

18. The package of claim 13, wherein the first electrical interconnect of the TSV is coupled to the embedded component through an RDL.

19. The package of claim 13, wherein the second electrical interconnect of the TSV is coupled to a laminate substrate disposed opposite the component.

20. The package of claim 13, further comprising peripheral copper posts disposed around the embedded component and configured to facilitate receipt of package on package (PoP) stacking of multiple semiconductor packages, wherein the PoP semiconductor package comprises one or more of a semiconductor die, system on chip (SoC), memory device, microprocessor, graphics processor, analog device, clock, or other semiconductor device.

* * * * *